(12) United States Patent
Liang et al.

(10) Patent No.: US 6,740,465 B2
(45) Date of Patent: May 25, 2004

(54) IMAGING MEDIA CONTAINING HEAT DEVELOPABLE PHOTOSENSITIVE MICROCAPSULES

(75) Inventors: Rong-Chang Liang, Sunnyvale, CA (US); Tienteh Chen, Penfield, NY (US); Xuan T. Phan, Raleigh, NC (US); Hsiu-Pin Chang, Milpitas, CA (US)

(73) Assignee: SiPix Imaging, Inc., Milpitas, CA (US)

( * ) Notice: Subject to any disclaimer, the term of this patent is extended or adjusted under 35 U.S.C. 154(b) by 0 days.

(21) Appl. No.: 09/872,811

(22) Filed: May 31, 2001

(65) Prior Publication Data

US 2002/0155372 A1 Oct. 24, 2002

Related U.S. Application Data

(60) Provisional application No. 60/208,517, filed on Jun. 1, 2000.

(51) Int. Cl.[7] .................................. G03C 1/72
(52) U.S. Cl. ..................... 430/138; 430/211; 430/235; 430/265
(58) Field of Search ................ 430/138, 211, 430/235, 265

(56) References Cited

U.S. PATENT DOCUMENTS

| | | | |
|---|---|---|---|
| 3,276,804 A | 10/1966 | Heppner | |
| 3,390,996 A | 7/1968 | MacLachlan | |
| 3,445,261 A | 5/1969 | Talvalkar | 117/36.9 |
| 3,732,120 A | 5/1973 | Brockett et al. | |
| 3,796,696 A | 3/1974 | Brown | |
| 4,032,690 A | 6/1977 | Kohmura et al. | 428/263 |
| 4,399,209 A | 8/1983 | Sanders et al. | |
| 4,413,048 A | 11/1983 | Landa | 430/115 |
| 4,416,966 A | 11/1983 | Sanders et al. | |
| 4,440,846 A | 4/1984 | Sanders et al. | |

(List continued on next page.)

FOREIGN PATENT DOCUMENTS

| | | | |
|---|---|---|---|
| EP | 0 109 838 A2 | 5/1984 | |
| EP | 0 587 410 A2 | 3/1994 | |
| JP | 58 211488 | 12/1983 | B41M/5/12 |
| JP | 19820095242 | 12/1983 | |
| JP | 189340/84 | 8/1986 | |

OTHER PUBLICATIONS

Dalisa, A.L., "Electrophoretic Display Technology", *IEEE Trans. Electr. Dev.*—24:827–834 (1977).

"Enki Sei Senryo (Basic Dyes) of Senryo Binran (Dye Handbook)," edited by the Society of Organic Chemistry.

(List continued on next page.)

*Primary Examiner*—Janet Baxter
*Assistant Examiner*—Amanda C. Walke
(74) *Attorney, Agent, or Firm*—Albert P. Halluin; Viola T. Kung; Howrey, Simon, Arnold & White, LLP

(57) ABSTRACT

Photothermally sensitive recording sheets for color imaging are disclosed comprising a transparent support sheet having a thermal slip layer disposed on one surface of the support and a heat sensitive image layer on the opposite surface of the support. A second opaque (paper) or transparent (plastic) sheet is laminated to the color-producing layer. The image layer comprises photohardenable microcapsules containing a photopolymerizable or photocrosslinkable compound, a photoinitiator and a dye precursor and a developer material external to the microcapsules. Image-wise exposure of the recording sheet to actinic radiation causes selective photohardening of microcapsules sensitive to that radiation. Heating the resultant exposed recording sheet to a temperature well above the developer melting point by for example a thermal head allows the developer to selectively permeate the non-photohardened capsules resulting in the development of an image, including full color images. The recording sheets are suitable for use in high speed printing applications such as computer print out paper, battery operated printers for digital camera or personal digital assistance, labels, medical imaging, and color proofing films.

27 Claims, 1 Drawing Sheet

U.S. PATENT DOCUMENTS

| | | | | |
|---|---|---|---|---|
| 4,442,179 | A | | 4/1984 | Igarashi et al. ............. 428/220 |
| 4,460,626 | A | | 7/1984 | Nakamura et al. .......... 427/150 |
| 4,591,887 | A | | 5/1986 | Arbree et al. ................ 346/200 |
| 4,598,035 | A | | 7/1986 | Usami et al. |
| 4,598,036 | A | | 7/1986 | Iwasaki et al. ............. 430/270 |
| 4,690,825 | A | | 9/1987 | Won .......................... 424/501 |
| 4,751,165 | A | * | 6/1988 | Rourke et al. .............. 430/138 |
| 4,766,050 | A | * | 8/1988 | Jerry .......................... 430/138 |
| 4,772,530 | A | | 9/1988 | Gottschalk et al. |
| 4,772,541 | A | | 9/1988 | Gottschalk et al. |
| 4,816,371 | A | * | 3/1989 | Wright et al. ............... 430/138 |
| 4,885,271 | A | | 12/1989 | Kawakami et al. |
| 4,898,849 | A | | 2/1990 | Kang .......................... 503/214 |
| 4,921,832 | A | * | 5/1990 | Adair et al. ................. 503/201 |
| 4,950,641 | A | | 8/1990 | Hann et al. |
| 4,952,478 | A | * | 8/1990 | Miyagawa et al. .......... 430/138 |
| 5,015,549 | A | * | 5/1991 | Grosso et al. ................. 430/45 |
| 5,028,579 | A | * | 7/1991 | Inui et al. .................... 503/201 |
| 5,030,539 | A | * | 7/1991 | Kintz et al. .................. 430/138 |
| 5,043,757 | A | * | 8/1991 | Sakai ............................ 355/27 |
| 5,130,293 | A | | 7/1992 | Saito et al. |
| 5,141,915 | A | | 8/1992 | Roenigk et al. ............. 503/227 |
| 5,168,029 | A | | 12/1992 | Igarashi et al. |
| 5,230,982 | A | | 7/1993 | Davis et al. |
| 5,260,255 | A | * | 11/1993 | Sudo et al. .................. 503/227 |
| 5,277,992 | A | | 1/1994 | Shinohara et al. |
| 5,372,988 | A | | 12/1994 | Takeuchi et al. |
| 5,550,627 | A | | 8/1996 | Dowler et al. |
| 5,573,885 | A | * | 11/1996 | Inui et al. .................... 430/138 |
| 5,578,824 | A | | 11/1996 | Koguchi et al. ............. 250/318 |
| 5,589,100 | A | | 12/1996 | Grasso et al. .......... 252/299.01 |
| 5,783,353 | A | | 7/1998 | Camillus et al. |
| 5,835,174 | A | | 11/1998 | Clikeman et al. ............. 349/86 |
| 5,930,026 | A | | 7/1999 | Jacobson et al. ........... 359/296 |
| 5,939,207 | A | | 8/1999 | Fensore et al. .............. 428/500 |
| 5,976,405 | A | | 11/1999 | Clikeman et al. ...... 252/299.01 |
| 6,022,664 | A | * | 2/2000 | Washizu et al. ............. 430/138 |
| 6,030,740 | A | * | 2/2000 | Polykarpov ................. 430/138 |
| 6,037,058 | A | | 3/2000 | Clikeman et al. ......... 428/402.2 |
| 6,046,758 | A | * | 4/2000 | Brown et al. ................ 347/203 |
| 6,084,623 | A | * | 7/2000 | Shibasaki .................... 347/172 |
| 6,326,120 | B1 | * | 12/2001 | Wang et al. ................. 430/138 |
| 6,331,374 | B1 | * | 12/2001 | Hare et al. ................... 430/211 |
| 6,383,707 | B1 | * | 5/2002 | Anderson et al. ........... 430/138 |
| 6,387,585 | B1 | * | 5/2002 | Katampe .................... 430/138 |
| 2002/0004184 | A1 | * | 1/2002 | Polykarpov et al. ........ 430/362 |
| 2002/0045121 | A1 | * | 4/2002 | Higuchi et al. ............. 430/138 |

OTHER PUBLICATIONS

Harvey, T.G., "Replication techniques for micro–optics", *SPIE Proc.—3099*:76–82 (1997).

Hoyle, C.E., "Radiation Curing of Polymeric Materials", *ACS Symposium Series*—vol. 417 (1990).

James, T.H., "The Theory of the Photographic Process", *Macmillan Publishing Co., Ltd.* (1977).

"Kinoseri Shikiso no Kagaku (Chemistry of Functional Coloring Matters)", pp. 1–32, 189–206 and 401–413 published by CMC Shuppan Sha.

Murau, P., et al., "The understanding and elimination of some suspension instabilities is an electrophoretic display", *J. Appl. Phys.—49*(9):4820–4829 (1978).

Slafer, W.D., et al., "Continuous Manufacturing of Thin Cover Sheet Optical Media", *SPIE Proc.—1663*:324 (1992).

Drzaic, P. et al. *Liquid Crystal Dispersions* Series on Liquid Crystals vol.1 World Scientific Publishing Co. Pte. Ltd. (1995).

Hann, R. et al. "Control of D2T2 Print Quality by Back Coat Friction Properties" International Congress on Advances in Nonimpact Printing Technologies Edit 9:322–325 (1993).

Hann, R. et al. "Design of the Ribbon Back Coat for Thermal Dye Transfer (D2T2) Printing" IS&T's Tenth International Congress on Advances in Non–impact Printing Technologies 368–370 (1994).

* cited by examiner

IMAGING MEDIA CONTAINING HEAT DEVELOPABLE PHOTOSENSITIVE MICROCAPSULES

RELATED APPLICATION INFORMATION

This application claims priority from provisional patent application No. 60/208,517 filed Jun. 1, 2000 which is incorporated by reference herein for all purposes.

BACKGROUND OF THE INVENTION

1. Field of the Invention

This invention relates to thermally printable imaging materials containing color-forming precursors encapsulated in photosensitive microcapsules.

2. Description of Related Art

Photohardenable imaging systems employing microencapsulated radiation sensitive compositions are the subject of U.S. Pat. Nos. 4,399,209, 4,416,966 and 4,440,846. These imaging systems are characterized in that an imaging sheet including a layer of microcapsules containing a photohardenable composition in the internal phase is image-wise exposed to actinic radiation. In the most typical embodiments, the photohardenable composition is a photopolymerizable composition including a polyethylenically unsaturated compound and a photoinitiator and is encapsulated with a color former. Exposure to actinic radiation hardens the internal phase of the microcapsules. Following exposure, the imaging sheet is subjected to a uniform rupturing force by passing the sheet through the nip between a pair of pressure rollers.

U.S. Pat. No. 4,440,846 discloses a self-contained imaging sheet in which the encapsulated color former and the developer material are co-deposited on one surface of a single substrate as one layer or as two contiguous layers. Upon image-wise exposing the imaging sheet and passing the sheet through pressure rollers, the microcapsules rupture and image-wise release the internal phase whereupon the color former migrates to the developer material where it reacts with the developer material and forms a colored image.

Variations of the processes described above have also been described for making panchromatic full color images, as described in U.S. Pat. Nos. 4,772,530 and 4,772,541. In the color system, photosensitive microcapsules containing cyan, magenta and yellow color-forming dyes are layered on a support and exposed to red, green and blue light. Capsules containing the cyan precursor are photohardened by exposure to red light; capsules containing the magenta precursor are photohardened by exposure to green light and capsules containing the yellow precursor are photohardened by exposure to blue light. Selective exposure of the capsule layer to light of different wavelength, followed by rapture of non-exposed capsules gives rise to full color images on the support sheet after contact of the dye contents of the capsule with a suitable developer.

U.S. Pat. No. 5,783,353 further discloses a self contained imaging assembly capable of producing full color images as described above wherein a composition comprising photohardenable microcapsules and a developer material is disposed between a first transparent support and a second support which may be opaque or transparent to form a sealed assembly. The assembly is image-wise exposed to actinic radiation and subjected to a uniform rupturing force to provide an image in said composition which is visible against the second opaque support when viewed through the first transparent support or, if the second support is transparent, when the image is viewed as a transparency.

One major drawback associated with the systems described above is that there is no mechanism for fixing the image after the capsules are fractured (opened) and the dye precursor contacts the developer. The image contrast thus becomes sharper and sharper after printing which leads to poor preservation of mid-tone images. Also, the process has relatively low printing speed, poor environmental stability and reproducibility, relatively poor resolution as a function of larger microcapsule size (up to 15 microns) required for fracturing and requires the use of bulky capsule fracturing equipment such as described in U.S. Pat. No. 5,550,627.

Thermal techniques for producing images involving the use of encapsulated color precursors are also known. U.S. Pat. No. 4,598,035 discloses heat sensitive recording material comprising a support having on a surface an imaging layer comprising a plurality of microcapsules encapsulating a color precursor disposed in a binder containing a color developer or coupler. Selective image-wise heating of the layer by proximate contact with a thermal recording head causes the color precursor and/or the developer to permeate through the microcapsule walls selectively only in the heated areas, resulting in a colored image.

For color applications, a support comprising three separate imaging layers containing encapsulated diazonium salts or leuco dyes and non-encapsulated coupler or developer dispersions capable of forming yellow, magenta and cyan images when the coupler or developer is contacted with the diazonium salt or leuco dye are provided. The encapsulant materials in each layer are designed to be sensitive to different levels of heat energy such that image-wise thermal head exposure at low heat selectively activates the topmost yellow layer, image-wise thermal head exposure at moderate heat selectively activates the middle magenta layer and finally exposure at higher heat activates the bottom cyan layer. The structure is exposed to ultra violet light after heat exposure in each of the first two steps to decompose the diazonium salt which fixes the yellow and magenta images. Multicolor images of this type are disclosed in U.S. Pat. No. 5,168,029.

Thermal processes of the type described above require complex imaging materials and are subject to printing/temperature variations which can lead to poor image quality and image reproducibility. Also, the need to precisely vary and modulate the temperatures and thermal energy in the printing head for image-wise thermal heating of the heat exposed layers necessarily slows down the process.

SUMMARY OF THE INVENTION

In accordance with this invention, a heat sensitive recording sheet is provided comprising a support layer comprising transparent sheet material and a heat sensitive imaging layer disposed on one surface of said first support layer, said imaging layer comprising a mixture of:

i) a plurality of light sensitive microcapsules comprising a polymeric matrix or wall material and a photopolymerizable or photocrosslinkable composition, a photoinitiator and a color dye precursor;

ii) a finely divided particulate developer or coupler material having a melting point or melt flow temperature in excess of 70° C. which is reactive in contact with said color precursor to form a color;

said microcapsules characterized as permeable to said developer material after said recording sheet is heated to a temperature above the melting point or melt flow temperature of said developer or coupler, preferably to a temperature also above the Tg of the polymeric matrix or wall material, sufficient to form an image in an imaging process and impermeable to said developer or coupler material after said microcapsules are photohardened by exposure to a pattern of actinic radiation and said recording sheet is heated to a temperature above the melting point or melt flow temperature of said developer or coupler in an imaging process. The invention also provides a thermal imaging process for forming mono or polychromatic images comprising:

a) providing a heat sensitive recording sheet comprising:
  i) a first support layer comprising transparent sheet material;
  ii) a thermal slip layer disposed on one surface of said first support layer;
  iii) a heat sensitive imaging layer disposed on the opposite surface of said first support layer; and
  iv) a second opaque or transparent sheet material bonded to said heat sensitive imaging layer,
said imaging layer comprising a mixture of (1): a plurality of light sensitive microcapsules comprising a polymeric wall or matrix material and a photo-polymerizable or photo-crosslinkable composition, a photoinitiator and a color dye precursor as an internal phase, and (2) a finely divided particulate developer or coupler material having a melting point or melt flow temperature in excess of 70° C. which is reactive in contact with said color precursor to form a color;

b) image-wise exposing said recording sheet to a pattern of actinic radiation wherein microcapsules sensitive to said radiation are selectively photohardened; and c) heating said recording sheet to a temperature above the melting point or melt flow temperature of said developer or coupler material such that the developer or coupler material flows into contact with said microcapsules, wherein photohardened microcapsules are impermeable to said developer or coupler material and non-photohardened microcapsules are permeable to said developer or coupler material sufficient to form a color image.

The heat sensitive recording sheets of the invention may be characterized as a self contained imaging assembly capable of producing color images in two simple steps: 1) image-wise exposure of the heat sensitive recording sheet to actinic radiation, followed by 2) uniformly and rapidly heating the exposed heat sensitive recording sheet under low pressure to a temperature well above the melting point or melt flow temperature of the developer or coupler, such as by contact with a thermal printing head, sufficiently to develop an image. The process is considerably simpler and faster than the prior art imaging processes described above and does not require the use of high pressure roller or other microcapsule fracturing equipment, registration mechanism for multiple pass thermal printing, narrow band ultra-violet light sources or multiple image layers. Images produced by the system of the invention are of high density, excellent resolution and have good mid-tone image preservation.

The image assembly of the present invention may be exposed in any suitable photo exposure device to provide an image. The imaging assembly of this invention is especially suitable for exposure using a liquid crystal array or light emitting diodes driven by a computer generated signal or a video signal for the reproduction of images from a video cassette recorder, a camcorder, or the like.

DETAILED DESCRIPTION OF THE INVENTION

Figure 1:
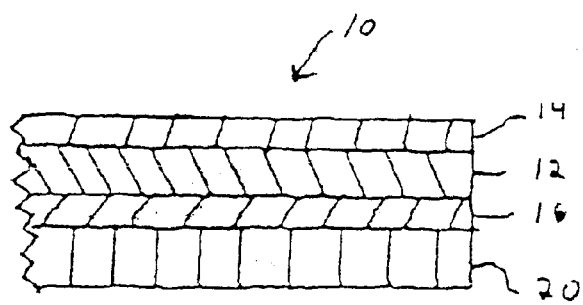
FIG. 1 is a schematic cross-sectional view of a recording sheet in accordance with this invention.

Referring to FIG. 1, recording sheet 10 is shown to include a first transparent support sheet 12 having a thermal slip layer 14 disposed on one surface and a color-producing imaging layer 16 disposed on the opposite surface. A second opaque or transparent sheet material 20 is bonded to imaging layer 16.

Figure 2:
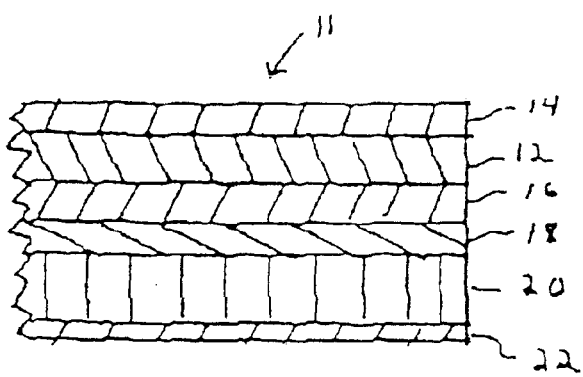
FIG. 2 is a schematic cross-sectional view of a different embodiment of a recording sheet in accordance with this invention.

Referring to FIG. 2, another embodiment shows recording sheet 11 including structures 14, 12, 16, and 20 as described above except that an adhesive layer 18 is interposed between imaging layer 16 and the second sheet material 20. Adhesive layer 18 may also contain heat sensitive color chemicals as described hereafter. An optional pressure sensitive adhesive layer 22 with or without a peelable backing layer is shown adjacent the outer surface of sheet layer 20.

Transparent sheet material which may be used in fabricating the heat sensitive recording sheet is suitably selected from plastic films or transparent papers having a thickness from about 0.5 to 50 microns, more preferably from about 2 to 20 microns and most preferably from about 3 to 8 microns. The plastic film to be used is not limited. Particularly useful are synthetic resin transparent films including polyethylene terephthalate, polybutylene terephthalate, polyethylene naphthalate and other polyester films, polycyclic olefin films, polycarbonate film, polyamide film, polysulfone film, polyether sulfone film, polyether ketone film, polyether imide film, polyphenylene sulfide film, polyester ether film, polyamide imide film, fluorocarbon resin film, polyurethane film, acrylic film and others. These films can be used singly, or as affixed to one another. The preferred film material is polyethylene terephthlate (PET) film which is biaxially oriented during film manufacture.

Films which have been pretreated (sub coated) on one or both sides by the film manufacturer by a clear primer coating (thickness of 0.05 to 0.15 microns) which impart hydrophilic properties to the film surfaces are especially useful. Such primer coatings include acrylic or methacrylic acid and/or ester copolymers, amorphous polyesters, polyurethanes, polyvinyl acetate, polyvinyl alcohol and like hydrophilic materials. Such primer coatings enhance adhesion of certain coatings subsequently applied to the film surface. Treatment of the film surfaces by corona or plasma discharge prior to applying subsequent coatings is another effective technique for adhesion enhancement.

In a preferred embodiment of the invention, a transparent thermal slip layer (14) is applied to one surface of the transparent sheet material (12). The purpose of this layer is to reduce friction or dragging of the film surface as it passes by in close proximity to or in contact with a thermal printing head during the imaging process. Suitable materials are those which are relatively stable and do not become tacky at printing head temperatures of about 200–°400° C. and which serve to lower the kinetic friction coefficient between the recording sheet and the printer head to a value of less than 0.35, preferably less than 0.25. Suitable slip materials include waxes, polysiloxanes (silicone oil), phosphoric acid esters, fatty acid salts, long chain fatty acid esters or amides, fluorinated polymers such as polytetrafluoroethylene (Teflon®), silicon containing polymers such as acrylic silicon graft copolymers, graphite powders and like materials. These materials may be applied directly to the film surface as solutions or dispersions in water or organic solvents and dried.

In many cases it is desirable to use these slip agents in combination with a binder resin composition to form slip layers which improve the thermal stability of the recording sheet surface. Suitable thermally stable binders are crosslinkable polymers which are formulated with a suitable crosslinking agent such that a thermoset slip layer is formed after the composition is applied to the transparent sheet material and dried at elevated temperatures. Suitable polymers are those containing free hydroxy groups which are crosslinkable using polyisocyanates such as toluene diisocyanate, or polymers containing free acid groups which are crosslinkable using polyfunctional amines such as melamine or urea. Suitable such polymers include cellulose acetate, cellulose acetate butyrate, cellulose acetate propionate, polyester urethanes, polyvinyl butyral, urethane or epoxy prepolymers and like materials. Polymers curable by UV or electron beam radiation may also be used, as well as polymers from monomers which are photopolymerizable, such as epoxy acrylates. The binder-containing slip layer may contain from about 1 to about 35% by weight of the slip agent on a dry weight basis, more preferably from about 5 to 30% by weight. The balance of the layer contains the binder polymer, the crosslinking agent, if present, and 0–20% by weight of other conventional additives such as antistatic agents, fillers, antioxidants and the like. The slip layer must also be optically transparent.

These binder-containing slip layers containing a mixture of polymer, one or more slip agents described above, appropriate crosslinking agents and other conventional additives dissolved or dispersed in suitable organic solvent or water may be applied as a solution to the surface of the transparent sheet material and dried at a temperature in the range of about 50–°150° C. sufficient to form a thermoset coating layer on the film surface. These binder-containing slip layers may be applied at a dry coating thickness in the range of about 0.1 to 5 microns, or a dry coating weight of 0.1 to 5 grams of solids per square meter. Advantageously, the slip layer is applied to and cured on the surface of the first support layer prior to application of the color-producing image layer as described below, since this eliminates the possibility of heat-induced color-producing reactions from taking place.

Slip layers of this type which are used as back coatings in thermal transfer printing materials are more completely disclosed in U.S. Pat. Nos. 4,950,641, 5,130,293, 5,277,992, and 5,372,988, the complete disclosures of which are incorporated herein by reference.

A color-producing layer (16) hereafter referred to as an image layer, is applied to the surface of the transparent sheet material (12) opposite slip layer (14). This image layer may consist of a single layer or may comprise two separate layers disposed adjacent one another. This layer contains the chemistry by which dark or colored images are formed within the layer as a consequence of the selective image-wise exposure of the recording sheet to actinic radiation through slip layer (14) and support sheet (12), followed by heating of the recording sheet.

Figure 3:
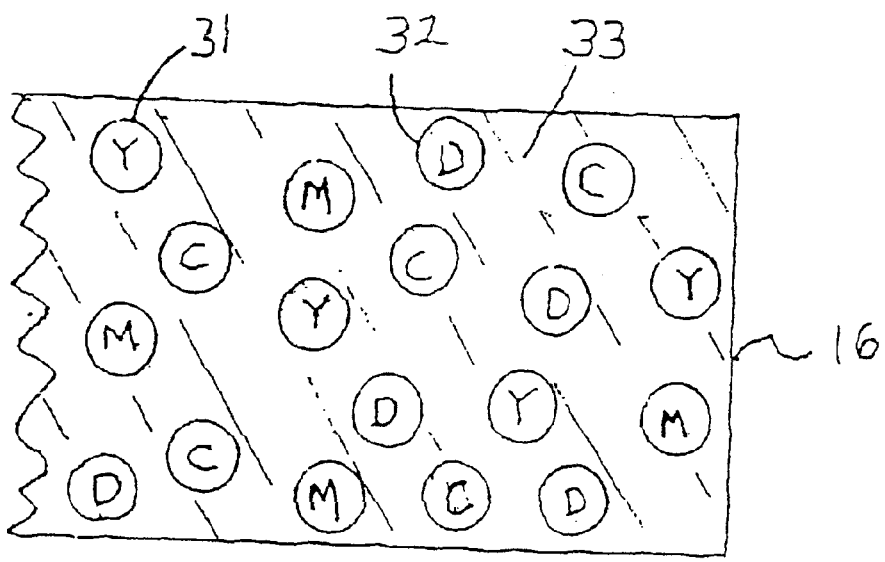
FIG. 3 is a schematic cross-sectional view of the imaging layer present in the recording sheet in accordance with this invention.

As illustrated in FIG. 3, image layer (16) comprises a combination of light sensitive microcapsules (31) and finely divided particulate developer material having a melting point or melt flow temperature in excess of 70° C. (32), preferably between 80° C. and 250° C., even more preferably between 90° C. and 200° C., optionally dispersed in or held together by a thermoplastic polymer binder (33).

The light sensitive microcapsules (31) comprise a polymeric wall or matrix material and a photo-polymerizable or photocrosslinkable composition, a suitable photoinitiator and a color dye precursor as an internal phase. Optionally a crystalline plasticizer or thermal solvent or sensitizer may be added to the internal phase to improve the heat sensitivity.

The photo-polymerizable or photocrosslinkable composition used in the present invention includes a multivalent monomer or oligomer material containing ethylenic unsaturation which is capable of crosslinking by radical addition polymerization, ionic polymerization, thiol-ene reaction, insertion, or [2+2] addition reaction. In one embodiment of the invention, the ethylenic unsaturation group is grafted onto the polymeric wall or matrix material of the microcapsule.

The most typical examples of a free radical addition polymerizable or crosslinkable compounds useful in the present invention are ethylenically unsaturated compounds and, more specifically, polyethylenically unsaturated compounds. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such trimethylolpropane, pentaerythritol, and the like; and acrylate or methacrylate terminated epoxy resins, acrylate or methacrylate terminated polyesters or polyurethanes, vinylbenzene, vinylethers or maleimide terminated oligomers or polymers and the like. Representative examples include trimethylolpropane triacrylate (TMPTA), pentaerythritol tetracrylate, pentaerythritol tetramethacrylate, dipentaerythritol hydroxypentacrylate (DPHPA), tris(2-hydroxyethyl) isocyanurate triacrylate, 1,2,4-butanetriol trimethacrylate, 1,4-cyclohexanediol diacrylate, 1,4-benzenediol dimethacrylate, pentaerythritol tetraacrylate, pentaerythritol tetramethacrylate, dipentaerythritol hydroxypentacrylate (DPHPA), diethylene triamine tris-methacrylamide; vinyl esters such as divinyl succinate, divinyl adipate, divinyl phthalate, divinyl terephthalate, and divinyl benzene. Acrylate or methacrylate terminated oligomers, such as epoxy, urethane, polyether, and polyester are also well known in the art and can be found in "Radiation Curing of Polymeric Materials" edited by C. E. Hoyle and J. F. Kinstle, ACS Symposium Series, vol. 417(1990). A wide range of commercial available oligomers terminated with acrylate or methacrylate suitable for this application can be obtained from Sartomer, Radcure, Henkel, or UCB Chemicals.

In addition, mono functional monomers can also be used to modify the physical properties of the photopolymerizable compounds. Preferred monofunctional monomers suitable for this application are high boiling point, water immiscible monomers such as stearyl acrylate, lauryl acrylate, and polypropylene glycol monoacrylate.

It is important that the photopolymerizable or photo-crosslinkable monomers or oligomers should not permeate or soften the microcapsule wall over a period of storage. Particularly preferred monomers are monoethylenically unsaturated monomers also containing a functional group which is reactive with the wall-forming components during the creation of the microcapsules, such as isocyanate, thiol, hydroxy, epoxy, carboxy or amine functionality. Such monomers include 2-isocyanatoethylacrylate and methacrylate, TMI® (from American Cynamide Co.), hydroxy alkyl acrylate or methacrylate, glycidyl acrylate and methacrylate, methyl ester of acryloamidoglycolic acid, acetoacetoxyethyl-methacrylate, etc. In one of the preferred embodiment, the functionalized monomers are allowed to pre-react with the wall forming material such as polyfunctional isocyanates before the emulsification step of microencapsulation. The monomer is grafted to the walls of the microcapsules thereby preventing permeation out of the microcapsule during storage.

Chain transfer agents can also be used to modify the crosslinking density of the photoexposed microcapsules. Typical examples include polyhalogenated compounds such as bis(trichloromethyl)triazine and its derivatives, 1,1-dimethyl-3,5-diketonecyclohexane, and organic thiols such as 2-mercaptobenzothiazole, 2-mercaptobenzoxazole, 2-mercaptobenzimidazole, and their disulfide derivatives, pentaerythritol tetrakis(mercaptoacetate). Other compounds useful as chain transfer agents in photopolymerizable or photocrosslinkable composition include dimer of alpha-methylstyrene, compounds containing allylic or benzylic hydrogen, e.g., cumene, (e) acetals, (f) aldehydes, (g) amides, as disclosed in column 12 lines 18 to 58 of Maclachlan, U.S. Pat. No. 3,390,996.

To reduce the viscosity of the internal phase during the emulsification step of microencapsulation and to assist the rate of color development, a high boiling organic solvent or plasticizer can be used. Examples include tricresyl phosphate, trioctyl phosphate, octyldiphenyl phosphate, tricyclohexyl phosphate, dibutyl phthalate, dioctyl phthalate, dilauryl phthalate, dicyclohexyl phthalate, butyl oleate, diethyleneglycol benzoate, dioctyl sebacate, dibutyl sebacate, dioctyl adipate, trioctyl trimellitate, octyl maleate, dibutyl maleate, isoamyl biphenyl or other alkylated biphenyls, alkylated terphenyls, chlorinated paraffin, diisopropyl naphthalene, 1,1'-dirollylethane, polypropylene glycol, and polytetramethylene glycol. Particularly preferred plasticizers are crystalline compounds having a melting point between 70° C. and 200° C., preferable between 90° C. and 150° C. Examples of the crystalline plasticizers include 1,2-bis(3,4-dimethylphenyl)ethane, stearamide, bee wax, terphenyl, diphenyl phthalate, dicyclohexyl phthalate, and glycerol tribenzoate.

The preferred photoinitiators used in the present invention are ionic dye-reactive counter ion photosensitizers which are selectively photosensitive within the spectral range of about 400 up to 700 nm.

Most preferred photoinitiators are cationic dye-borate anion compounds represented by the formula (I):

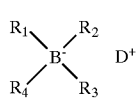

General formula (I)

wherein $D^+$ represents a cationic dye; $R_1$, $R_2$, $R_3$, $R_4$ which may be the same or different, each represent a substituted or unsubstituted alkyl group, a substituted or unsubstitued aryl group, a substituted or unsubstituted alkenyl group, a substituted or unsubstituted alkynyl group, or a substituted or unsubstituted heterocyclic group, and two or more of said $R_1$, $R_2$, $R_3$, $R_4$ may combine with each other to form a cyclic structure.

An alkyl group represented by $R_1$ to $R_4$ includes a straight, branched or cyclic alkyl group and preferably has 1 to 18 carbon atoms, such as a methyl group, an ethyl group, a propyl group, an isopropyl group, a butyl group, a pentyl group, a hexyl group, an octyl group, a stearyl group, a cyclobutyl group, a cyclopentyl group, a cyclohexyl group, etc. A substituted alkyl group represented by $R_1$ to $R_4$ includes an alkyl group described above having a substituent, such as a halogen atom, e.g., a chlorine atom, a bromine atom, etc.; a cyano group; a nitro group; a hydroxy group; an alkoxy group; an aryl group, preferably, a phenyl group; a hydroxyl group; a $—N{=}R_5R_6$ group, wherein $R_5$ and $R_6$ each represents a hydrogen atom, an alkyl group having 1 to 14 carbon atoms or an aryl group; a $—COOR_7$ group, wherein $R_7$ represents a hydrogen atom, an alkyl group having 1 to 14 carbon atoms or aryl group; a $—OCOR_8$ group or a $—OR_8$ group, wherein $R_8$ represents an alkyl group having 1 to 14 carbon atoms or an aryl group.

An aryl group represented by $R_1$ to $R_4$ includes an aryl group having 1 to 3 rings, such as a phenyl group, a naphthyl group, etc., and a substituted aryl group represented by $R_1$ to $R_4$ includes an aryl group described above having the same substituent as that for the alkyl group or an alkyl group having 1 to 14 carbon atoms.

An alkenyl group represented by $R_1$ to $R_4$ includes a straight, branched or cyclic alkenyl group having 2 to 18 carbon atoms and a substituent for the alkenyl group includes the same substituent as that for the alkyl group.

An alkynyl group represented by $R_1$ to $R_4$ includes a straight or branched alkynyl group having 2 to 18 carbon atoms, and a substituent for the alkynyl group includes the same substituent as that for the alkyl group.

A heterocyclic group represented by $R_1$ to $R_4$ includes a 5 or more-membered ring, preferably 5 to 7-membered ring containing at least one atom selected from the group consisting of N, S and O, and the heterocyclic ring may contain a condensed ring. The substituent for the heterocyclic group includes the same substituent as that for the aryl group.

The borate anion in the general formula (I) is designed such that the borate radical generated upon exposure to light and after electron transfer to the dye readily dissociates with the formation of a radical as follows:

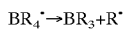

wherein R can be $R_1$, $R_2$, $R_3$ or $R_4$ defined above.

For example particularly preferred anions are triphenylbutylborate and trianisylbutylborate anions because they readily dissociate to triphenylborane or trianisylborane and a butyl radical. On the other hand, tetraphenylborate anion is very poor because the phenyl radical is not easily formed.

Preferably, at least one but not more than three of $R_1$, $R_2$, $R_3$, and $R_4$ in the general formula (I) is an alkyl group. Each of $R_1$, $R_2$, $R_3$, and $R_4$ can contain up to 20 carbon atoms, and they typically contain 1 to 7 carbon atoms. More preferably $R_1$, $R_2$, $R_3$, and $R_4$ are a combination of alkyl group(s) and aryl group(s) or arylalkyl group(s) and still more preferably a combination of three aryl groups and one alkyl group. Examples of the preferred borate anions represented by formula (I) include triphenylbutylborate, trianisylbutylborate, and tri(2,3,4,5,6-pentafluorophenyl) butylborate, tetra(2,3,4,5,6-pentafluorophenyl)borate, tri(3-fluorophenyl)-butylborate, and tri(3-fluorophenyl)-hexylborate.

Representative examples of alkyl groups represented by $R_1$–$R_4$ are methyl, ethyl, propyl, butyl, pentyl, hexyl, octyl, and stearyl. The alkyl groups may be substituted, for example, by one or more halogen, cyano, acyloxy, acyl, alkoxy or hydroxy groups.

Representative examples of aryl groups represented by $R_1$–$R_4$ include phenyl, naphthyl and substituted aryl groups such as anisyl. Alkylaryl groups include methylphenyl and dimethylphenyl. Representative examples of arylalkyl groups include benzyl. Representative alicyclic groups include cyclobutyl, cyclopentyl, and cyclohexyl groups. Examples of an alkynyl group are propynyl and ethynyl, and examples of alkenyl groups include a vinyl group.

Useful dyes form photoreducible but dark stable complexes with borate anions and can be cationic methine, polymethine, triarylmethane, indoline, thiazine, xanthene, oxazine and acridine dyes. More specifically, the dyes include cationic cyanine, carbocyanine, hemicyanine, rhodamine and azomethine dyes, quinoneimine oxazine dyes, and thiazine dyes; and quinoline dyes. Cyanine dyes, azine dyes and xanthene dyes are particularly useful in this invention. These dyes may be used singly or as a combination thereof. Specific examples of these dyes are described, for examples, in "Enki Sei Senryo (Basic Dyes)" of Senryo Binran (Dye Handbook), edited by the Society of Organic Chemistry, T. H. James, The Theory of the Photographic Process, pp. 194–290, published by Macmillan Publishing Co., Ltd., 1977, Kinosei Shikiso no Kagaku (Chemistry of Functional Coloring Matters), pages 1–32, 189–206, and 401–413, published by CMC Shuppan Sha, and Japanese patent Application (OPI) No. 189340/84.

In addition to being cationic, the dyes should not contain groups which would neutralize or desensitize the complex or render the complex poorly dark stable. Examples of groups which generally should not be present in the dye are acid groups such as free carboxylic or sulphonic acid groups.

Practical examples of cyanine dyes which are useful in the present invention are the dyes represented by formula (II):

General formula (II)

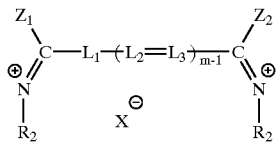

wherein $Z_1$ and $Z_2$ each represents an atomic group necessary for completing a heterocyclic nucleus, which is usually used for a cyanine dye, such as, in particular, a thiazole nucleus, a thiazoline nucleus, a benzothiazole nucleus, a naphthothiazole nucleus, an oxazole nucleus, an oxazoline nucleus, a benzoxazole nucleus, a naphthoxazole nucleus, a tetrazole nucleus, a pyridine nucleus, a quinoline nucleus, an imidazoline nucleus, an imidazole nucleus, a benzimidazole nucleus, a naphthoimidazole nucleus, a selenazoline nucleus, a selenazole nucleus, a benzoselenazole nucleus, a naphthoselenazole nucleus, and an indolenine nucleus. These nuclei may be substituted by a lower alkyl group (e.g., a methyl group), a halogen atom, a phenyl group, a hydroxy group, an alkoxy group having from 1 to 4 carbon atoms, a carboxy group, an alkoxycarbonyl group, an alkylsulfamoyl group, an alkylcarbonyl group, an acetyl group, an acetoxy group, a cyano group, a trichloromethyl group, a trifuloromethyl group, and a nitro group.

In formula (II) set forth above, $L_1$, $L_2$, and $L_3$ each represents a methine group or a substituted methine group. Examples of the substituent for the substituted methine group are a lower alkyl group (such as a methyl group, an ethyl group, etc.), a phenyl group, a substituted phenyl group, a methoxy group, an ethoxy group, and an arylalkyl group (e.g., a phenethyl group). $L_1$ and $R_1$, $L_3$ and $R_2$, or $L_2$ and $L_2$ in the case of m is 3 may be alkylene-crosslinked to form a 5-to 6-membered ring.

In formula (II), $R_1$ and $R_2$ each represents a lower alkyl group (e.g., preferably, an alkyl group having 1 to 8 carbon atoms), or an alkyl group substituted by a carboxy group, a sulfo group, a hydroxy group, a halogen atom, an alkoxy group having from 1 to 4 carbon atoms, a phenyl group, a substituted phenyl group (preferably, the alkylene moiety having from 1 to 5 carbon atoms), such as beta-sulfoethyl, gamma-sulfopropyl, gamma-sulfobutyl, delta-sulfobutyl, 2-[2-(3-sulfopropoxy)ethoxy]ethyl, 2-hydroxysulfopropyl, 2-chlorosulfopropyl, 2-methoxyethyl, 2-hydroxyethyl, carboxymethyl, 2-carboxyethyl, 2,2,3,3'-tetrafluoropropyl, and 3,3,3-trifluoroethyl, an allyl group, or other substituted alkyl group usually used for the N-substituent of cyanine dyes.

In formula (II), m represents 1, 2, or 3, and $X_1^{-1}$ represents the same boron compound anion as in formula (I).

Specific examples of the xanthene dyes useful in the present invention are those dyes represented by formula (III):

General formula (III)

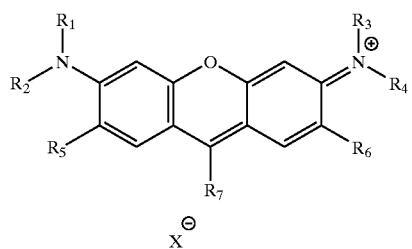

wherein $R_1$ to $R_7$ each represents a hydrogen atom, an alkyl group having from 1 to 6 carbon atoms or an aryl group; X represents a boron compound anion as described in formula (I); and Y represents an alkyl group, an aryl group, a hydrogen atom, or an alkali metal.

Examples of the organic boron compound anion salt of the preferred organic cationic dye compound for use in the present invention are illustrated below, but the invention is not limited to these compounds.

| Photoinitiator No. | Structure |
|---|---|
| 1 | |

-continued
| | | |
|---|---|---|
| 2 | 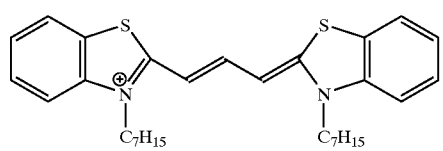 | 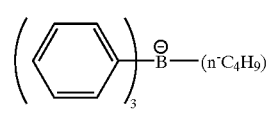 |
| 3 | 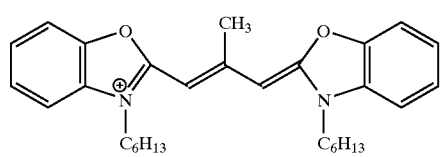 | 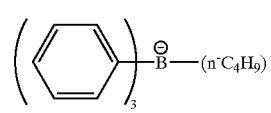 |
| 4 | 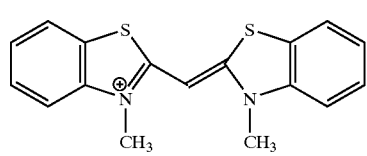 | 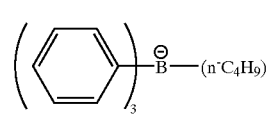 |
| 5 | 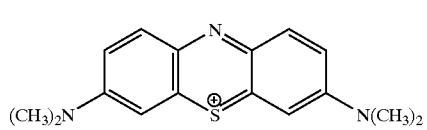 | 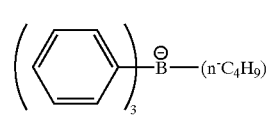 |
| 6 | 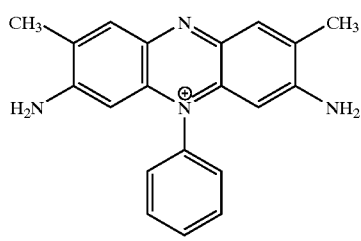 | 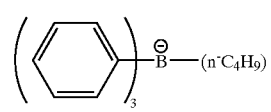 |
| 7 | 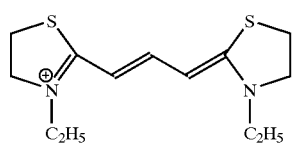 | 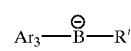 |
| No. | Ar | R' |
|---|---|---|
| 7A | phenyl | n-butyl |
| 7B | phenyl | n-hexyl |
| 7C | anisyl | n-butyl |
| | | |
|---|---|---|
| 8 | 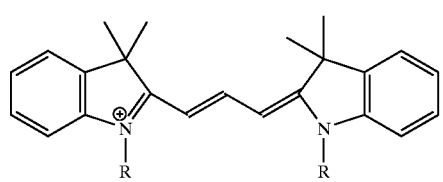 | 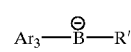 |
| No. | Ar | R | R' |
|---|---|---|---|
| 8A | phenyl | n-butyl | methyl |
| 8B | phenyl | n-hexyl | methyl |
| 8C | phenyl | n-butyl | n-butyl |
| 8D | phenyl | n-hexyl | n-butyl |
| 8E | phenyl | n-butyl | n-heptyl |
| 8F | phenyl | n-hexyl | n-heptyl |
| 8G | phenyl | n-butyl | ethyl |

-continued
| | | |
|---|---|---|
| 9 | 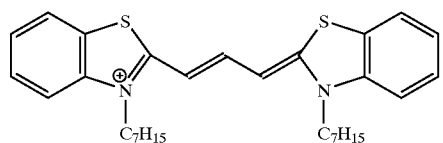 | 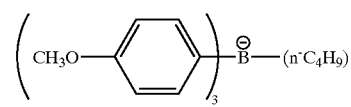 |
| 10 | 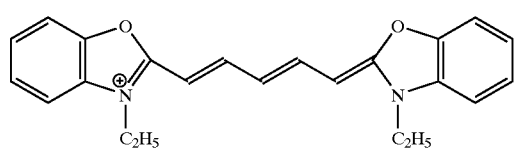 | 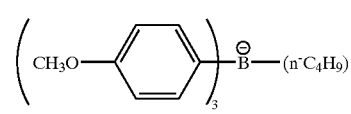 |
| 11 | 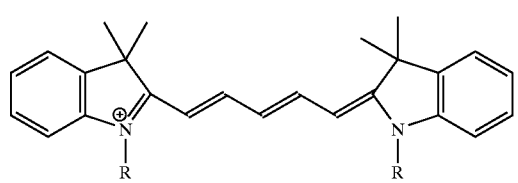 | 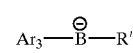 |
| No. | R | R' | Ar |
|---|---|---|---|
| 11A | methyl | n-butyl | phenyl |
| 11B | methyl | n-hexyl | phenyl |
| 11C | n-butyl | n-butyl | phenyl |
| 11D | n-butyl | n-hexyl | phenyl |
| 11E | n-pentyl | n-butyl | phenyl |
| 11F | n-pentyl | n-hexyl | phenyl |
| 11G | n-heptyl | n-butyl | phenyl |
| 11H | n-heptyl | n-hexyl | phenyl |
| | | |
|---|---|---|
| 12 | 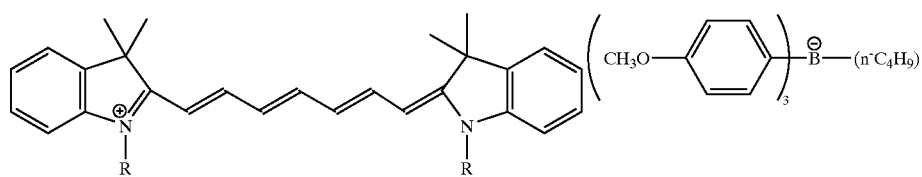 | |
| 13 | 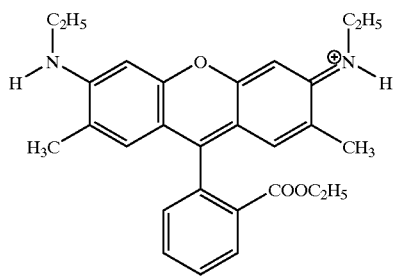 | 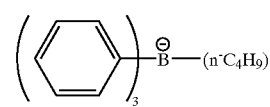 |
| 14 | 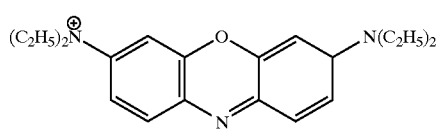 | 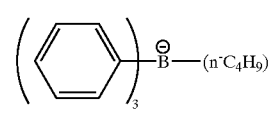 |
| 15 | 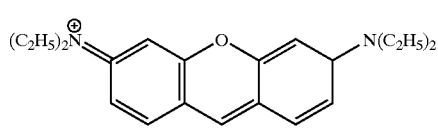 | 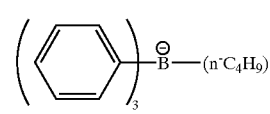 |

-continued
16 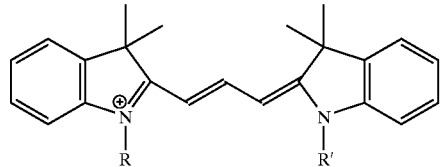
| No. | R | R' |
|---|---|---|
| 16A | methyl | n-butyl |
| 16B | methyl | n-hexyl |
| 16C | n-butyl | n-butyl |
| 16D | n-butyl | n-hexyl |
| 16E | n-pentyl | n-butyl |
| 16F | n-pentyl | n-hexyl |
| 16G | n-heptyl | n-butyl |
| 16H | n-hextyl | n-hexyl |
17 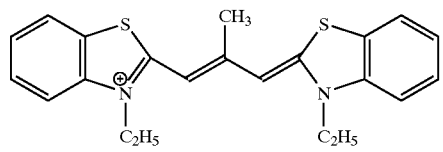
18 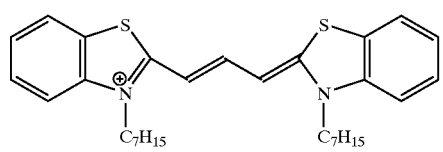
19 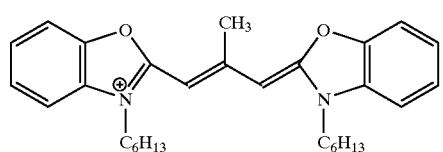
20 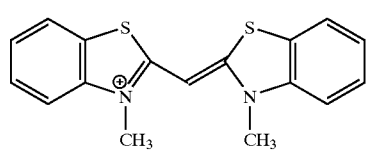
21 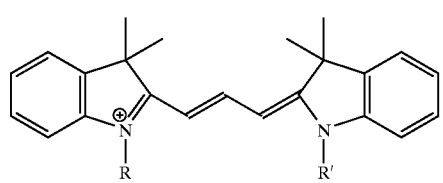
| No. | R | R' |
|---|---|---|
| 21A | methyl | n-butyl |
| 21B | methyl | n-hexyl |
| 21C | n-butyl | n-butyl |
| 21D | n-butyl | n-hexyl |
| 21E | n-pentyl | n-butyl |
| 21F | n-pentyl | n-hexyl |
| 21G | n-heptyl | n-butyl |
| 21H | n-hextyl | n-hexyl |

-continued

| 22 | 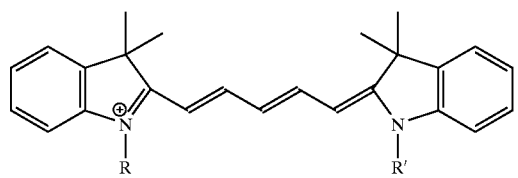 | 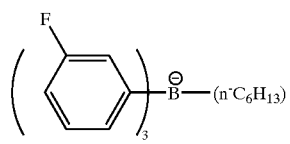 |

| No. | Ar | R' |
|---|---|---|
| 22A | methyl | n-butyl |
| 22B | methyl | n-hexyl |
| 22C | n-butyl | n-butyl |
| 22D | n-butyl | n-hexyl |
| 22E | n-pentyl | n-butyl |
| 22F | n-pentyl | n-hexyl |
| 22G | n-heptyl | n-butyl |
| 22H | n-hextyl | n-hexyl |

| 23 | 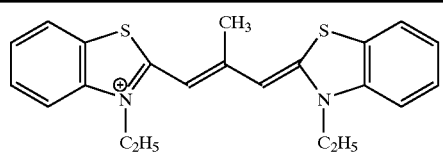 | 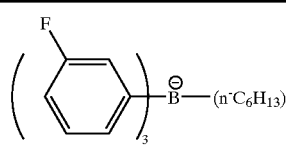 |
| 24 | 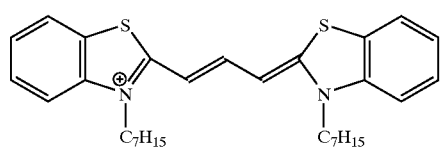 | 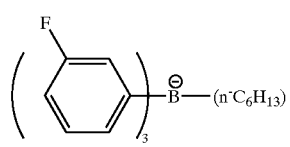 |
| 25 | 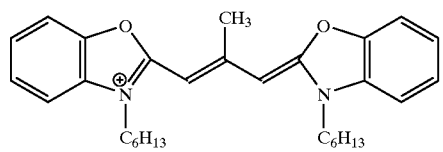 | 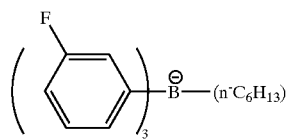 |

These photoinitiator materials are more specifically disclosed in U.S. Pat. Nos. 4,772,530 and 4,772,541, the complete disclosure of which patents is incorporated hereby by reference.

The ionic dye compound is usually used to an amount up to about 2% by weight based on the weight of the photopolymerizable or crosslinkable species in the photohardenable composition. More typically, the photoinitiator is used in an amount of about 0.1% to 1% by weight. It is preferable to use the compound in combination with an autoxidizer. An autoxidizer is a compound which is capable of consuming oxygen in a free radical chain process.

Examples of useful autoxidizers are N,N-dialkylanilines. Examples of preferred N,N-dialkylanilines are dialkylanilines substituted in one or more of the ortho-, meta-, or para-position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), acetylthio, fluoro, chloro, bromo and iodo.

Representative examples of N,N-dialkylanilines useful in the present invention are 4-cyano-N, N-dimethylaniline, 4-acetyl-N,N-dimethylaniline, 4-bromo-N,N-dimethylaniline, ethyl 4-(N,N-dimethylamino)benzoate, 3-chloro-N,N-dimethylaniline, 4-chloro-N,N-dimethylaniline, 3-ethoxy-N,N-dimethylaniline, 4-fluoro-N, N-dimethylaniline, 4-methyl-N,N-dimethylaniline, 4-ethoxy-N,N-dimethylaniline, N,N-dimethylthioanicidine, 4-amino-N,N-dimethylaniline, 3-hydroxy-N,N-dimethylaniline, N,N,N',N'-tetramethyl-1,4-dianiline, 4-acetamido-N, N-dimethylaniline, etc.

Preferred N,N-dialkylanilines are substituted with an alkyl group in the ortho-position and include 2,6-diisopropyl-N,N-dimethylaniline, 2,6-diethyl-N,N-dimethylaniline, N,N,2,4,6-pentamethylaniline (PMA), and p-t-butyl-N,N-dimethylaniline.

The autoxidizers are preferably used in the present invention in concentrations of about 0.5–5% by weight, preferably about 1–2% by weight.

Optionally, a disulfide compound described in U.S. Pat. No. 5,230,982 may be used to further improve the speed of photothermal development of the photographic materials of this invention. Such disulfides are particularly effective co-initiators for a photoinitiator system sensitive to actinic radiation, and more specifically to actinic radiation in the visible wavelength range. In such a system, each disulfide functions at least in part as an autooxidizer. Specific such disulfides are those having the structure (IV) wherein X is selected from the group consisting of S and O except in a specific case in which the disulfide is derived from one or more tetrazolyl groups; n represents 0 or 1; A represents the residue of the ring containing the N, C and X atoms, the ring containing five or six members and, in addition, said ring members may be fused to an aromatic ring; and $R_2$ in the second sulfide radical is derived from an aromatic radical selected from the group consisting of (1) phenyl (2) benzothiazolyl (3) tetrazolyl (4) benzoxazolyl (5) pyridinyl (6) pyrimidinyl (7) thiazolyl (8) oxazolyl (9) quinazolinyl and (10) thiadiazolyl, each of which may have a substituent on one or more C or N atom of the ring.

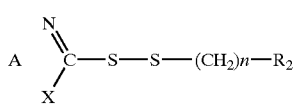

Formula (IV)

The disulfides of Formula (IV) act as particularly good autooxidizer when used in combination with cationic dye anionic borate absorbers and with N,N-dimethylanilines, and particularly with N,N-dimethylanilines substituted with one or two alkyl groups in the ortho-positions. 1 to 12% by weight of the disulfides based on the polymerizable monomer can be used.

The dye precursor present in the microcapsules in the image layer may be of the type generally known in the art which is activated by contact with a heat fusible proton donating (acidic) or electron accepting developer. The preferred leuco dyes are fluoran, lactone, triarylmethane phthalide, leuco triarylmethanes, thiazine, oxazine, or phenazine leuco dyes such as crystal violet lactone, 3-N-cyclohexyl, N-methyl-amino 6-methyl-7-anilino fluoran, 3-pyrrolidino-6-methyl-7-anilino fluoran, 3,3-bis(4-dimethylaminophenyl)phthalide, 6'(dipentylamino)-3'-methyl-2'(phenylamino)-spiro[isobenzofuran-1(3H), 9'-9[9H]xanthen]-3-one, 3,3-Bis(butyl-2-methyl-1H-indol-3-yl)-1-[3H]-isobenzofuranone, 2-phenylamino-3'-methyl-6'-(dibutylamino)-spiro[isobenzofuran-1(3H)-xanthen]-3-one, 3-[Butyl-2-methylindol-3-yl]-3-(1-octyl-2-methylindol-3-yl)-1(3H)isobenzofuranone, 3,6-dimethoxyfluoran, 3,7-bis(dimethylamino)-10-benzoylphenothiazine, 3-diethylamino-7,8-benzofluoran, 3,3-bis)1-n-butyl-2-methyl-indol-3-yl) phthalide, 3,3-bis(1-ethyl-2-methyl-indol-3-yl)phthalide. More preferred leuco dyes include lactone, fluoran, phenothiazine, and triarylpyridine leuco dyes such as BK 400 and BK 350, S206 from Sofix Corp., and Copikem 4 Black N102-T, Copichem 20 Magenta, Copikem 39 cyan, Copikem 34 Black, Copikem 1 Blue CVL-T, from Hilton Davis, ODB-1 and ODB-2 black leuco dyes from Yamada Chemical, and Pergascript I-3R Yellow leuco dye from Ciba Specialty Chemicals.

Suitable dyes of this type are more fully disclosed in U.S. Pat. Nos. 4,772,530 and 4,772,541, the complete disclosures of which patents are incorporated herein by reference.

The dye is present in the microcapsules as fine submicron size dispersion and may constitute from about 5 to 40 wt %, more preferably 10 to 30 wt % of the internal contents of the microcapsule.

The microcapsules used in accordance with the present invention may be formed by processes known in the prior art such as disclosed in U.S. Pat. No. 5,168,029, the complete disclosure of which is incorporated herein by reference. Wall forming agents such as polyureas, polyimides, polyesters, polycarbonates, melamines, and the like may be used. In order to impart heat-responding properties to capsule walls, it suffices for the capsule wall to have a Tg of from room temperature to 200° C., preferably from 70° C. to 150° C.

In order to control the glass transition temperature (Tg) of the polymeric capsule wall, a capsule wall-forming material is properly selected. As preferred examples of the wall-forming material, there are illustrated polyurethane, polyurea, polyamide, polyester, and polycarbonate, and polyurethane and polyurea are particularly preferable. The Tg of capsule wall can be further modified by pre-reacting the precursor of wall material such as polyisocyanates with polyols.

Microcapsules to be used in the present invention are formed by emulsifying a core substance containing wall forming materials and image-forming substances such as a leuco dye, a photo-initiator and a photo polymerizable compound, and forming a high polymer substance wall around the emulsified oil droplets. A second wall forming material may be added to the outside of the oil droplets to improve the barrier property. Methods to form the second wall include complex coacervation, liquid-liquid phase separation, and interfacial polymerization.

As a process for forming microcapsule walls of the present invention, a microencapsulation process by polymerization of reactants from inside of the oil droplets enables one to obtain, particularly within a short time, microcapsules of uniform size capable of forming recording materials with an excellent shelf life.

Techniques of microencapsulation, materials and specific examples of compounds to be used are described in U.S. Pat. Nos. 3,276,804 and 3,796,696, the disclosures of which are incorporated herein by reference. For example, in the case of using polyurethane or polyurea as a capsule wall-forming material, a polyvalent isocyanate and a second substance capable of reacting with the polyvalent isocyanate to form a capsule wall (for example, polyol or polyamine) are mixed in an aqueous phase or in an oily liquid to be encapsulated, and the resulting solution is emulsified and dispersed in water, followed by increasing the temperature to cause a high polymer-forming reaction at the interface of the oily droplets, whereby microcapsule walls are formed.

Glass transition point of the capsule wall can be greatly changed by properly selecting the first wall-forming substance, polyisocyanate, and the second wall-forming substance, polyol or polyamine.

As an organic solvent constituting the core of the capsules, high-boiling oils are used. Specific examples thereof include phosphoric acid esters, phthalic acid esters, acrylic acid esters and methacrylic acid esters, other carboxylic acids, fatty acid amides, alkylated biphenyls, alkylated terphenyls, alkylated naphthalenes, diarylethanes, chlorinated paraffins, and the like. Particularly preferred organic solvents are crystalline plasticizers having a melting point between 70° C. and 200° C., preferable between 90° C. and 150° C. Examples of the crystalline plasticizers include 1,2-bis(3,4-dimethylphenyl)ethane, stearamide, bee wax, m-terphenyl, o-terphenyl, p-terphenyl, diphenyl phthalate, dicyclohexyl phthalate, glycerol tribenzoate, benzyl 2-naphthyl ether, dimethyl terephthalate, 2-chloropropionanilide, 4-dibenzyldiphenyl, 1,2-di-(3-methylphenoxy)ethane, and dibenzyl oxalate.

The above-described organic solvents may be used in combination with a low-boiling auxiliary solvent to improve the microencapsulation process. Specific examples of the auxiliary solvent include acetone, ethyl acetate, isopropyl acetate, butyl acetate, methylene chloride, cyclohexanone, and the like.

In order to form stable emulsified oil droplets and control their particle size, a protective colloid or a surfactant may be added to the aqueous phase. As the protective colloid, water-soluble high polymers are generally usable. Example of protective colloids include poly(vinyl alcohol), poly(vinyl pyrrolidone), poly(N-ethyl-2-oxazoline), poly(N-methyl-2- oxazoline), polyacrylic acid, polyacrylamide, poly(styrene-co-maleic anhydride), salts of poly(styrene-co-maleic anhydride), ester of poly(styrene-co-maleic anhydride), poly(ethylene oxide-co-propylene oxide), poly(ethylene oxide-co-propylene oxide-co-ethylene oxide), and gelatin, etc.

In the present invention, the microcapsules have a size of from about 0.3 to 20 μm, more preferably from about 0.5 to 4 μm, even more preferably from about 0.8 to 2 μm in volume average value, for improvement of image resolving power and handling ease. The use of microcapsules less than 4 μm in size provides images of good resolution.

Thickness of the wall of the microcapsules is generally preferably from 0.05 to 1 μm, more preferably from 0.1 to 0.5 μm, though it depends upon the nature of the microcapsule wall-forming material and the size of the microcapsules. If the wall thickness is less than 0.05 μm, insulating action of the wall between core substances and outside of the microcapsule is insufficient, thus the desired performance of the microcapsule cannot be obtained since the core substances permeate to outside of the microcapsule, or outside substances permeate into the inside of the microcapsules. This will result in a high Dmin or fog. Alternatively, if it exceeds 1 μm, permeability of the wall by developer may not be sufficient during the heating process and Dmax of the image will be low.

In general, the microcapsules are formulated to contain from about 10 to 30% by weight of the color dye precursor, about 0.1 to 2% by weight of the photoinitiator and about 10 to 60% by weight of the photopolymerizable capsule hardening agent. The total polymer content constituting the capsule wall material will range from about 10 to 60% by weight of the microcapsule.

Acidic developer materials useful in the present invention comprise finely divided particulate material having an average particle size in the range of 0.2 to 3 microns and melting point or melt flow temperature of not less than about 70° C. It is essential that the developer be non-mobile and in solid form at temperatures which might be encountered during shipping or storage of the recording media, but be readily meltable and flowable when exposed to thermal imaging head temperatures in the range of about 180–°350° C. during the heat development process. Preferred developers are crystalline materials having melting points in excess of about 70° C. (e.g. in the range of 70–°200° C., preferably in the range of 90–160° C.). Any of the leuco dye developers known in the art and meeting these criteria can be used.

The developer materials conventionally employed in carbonless paper or thermal fax paper are useful in the present invention. Suitable developers include organic acidic material, optionally treated with a metal such as zinc or magnesium. Examples of materials which can be used in this invention include bisphenol A, 4,4'-dihydroxydiphenyl sulfone, phenolic condensation products, salicylic acid derivatives and their zinc salts, salicyloyl salicylate, para-benzyl hydroxy benzoate, sulfonylurea derivatives such as N-p-toluenesulfonyl-N'-phenylurea, 4,4'-bis(p-toluenesulfonylamino-carbonylamino)diphenylmethane, zinc 2-hydroxy naphthoate, zinc 5-methyl-3-octyl salicylate, zinc 3,5-di(methylbenzyl)salicylate, organic acids and acid estera such as gallic acid and propylgallate, phenol-formaldehyde novolak resins such as zinc modified oil soluble phenol-formaldehyde resin as disclosed in U.S. Pat. No. 3,732,120, and like materials. When phenolic condensates such as phenol/formaldehyde novolak or zinc derivatives thereof are used, they should be of relatively low molecular weight but have glass transition temperatures or melt flow temperature in excess of 70° C. Sulfonylurea type of developers are particularly useful. They include:

N-methanesulfonyl-N'-phenylurea, N-methanesulfonyl-N'-1-naphthylurea, N-trifluoromethanesulfonyl-N'-naphthylurea, N-ethanesulfonyl-N'-1-naphthylurea, N-cyclohexanesulfonyl-N'-phenylurea, N-allylsulfonyl-N'-1-naphthylurea, N-(2-methoxyethanesulfonyl)-N'-biphenylurea, N-(2-tetrahydropyransulfonyl)-N'-1-naphthylurea, N-(2-allyloxyethanesulfonyl)-N'-1-naphthylurea, N-isopropanesulfonyl-N'-benzylurea, N-isopropanesulfonyl-N'-(4-methylbenzyl)urea, N-methanesulfonyl-N'-(2-phenoxyethyl)urea, N-methanesulfonyl-N'-(4-chloro-1-naphthyl)urea, N-methanesulfonyl-N'-(4-methoxy-1naphthyl)urea, N-isopropanesulfonyl-N'-(4-chloro-1-naphthyl)urea, and N-methanesulfonyl-N'-1-naphthyl-thiourea, N-benzylsulfonyl-N'-phenylurea, N-(2-phenoxyethane)sulfonyl-N'-phenylurea, N-(4-methoxybenzyl)sulfonyl-N'-phenylurea, N-(2-(p-chlorophenyl)ethane)sulfonyl-N,phenylurea, N-(p-biphenyl)sulfonyl-N'-butylurea, N-benzylsulfonyl-N'-benzylurea, N-benzylsulfonyl-N'-(2-phenoxyethyl)urea, N-benzylsulfonyl-N'-(p-methoxyphenyl)urea, N-(p-methoxybenzyl)sulfonyl-N'-(2-(p-chlorophenyloxy)ethyl)urea, and N-benzylsulfonyl-N'-phenylthiourea.

A mixture of the photosensitive microcapsules and the developer is applied to the surface of support layer (12) opposite the slip layer (14) to form image layer (16). Preferably the microcapsules and developer are combined with a suitable thermoplastic polymeric binder to facilitate coating and adhesion of the image layer to the support. Suitable binder polymers include amorphous polyesters, polyacrylates, styrene copolymers and the like. The preferred polymeric binder of the image layer, for processing purposes, is preferably at least partly water-soluble or water dispersible. It comprises one or a mixture of resinous materials which act to hold the other constituents of the layer together. The preferred binder material is polyvinyl alcohol. Other known binders which may be used include ployvinylpyrrolidone, polyacrylamide, modified celluloses and starches. Latex polymers such as acrylic latex and, polystyrene-butadiene latex, polyvinylacetate copolymer latex and polyvinylidene chloride copolymer latex are also useful, particularly when used together with water soluble polymers.

The image layer may also contain a developer neutralizing agent which may comprise a neutral colored, water-insoluble finely divided particulate material such as magnesium carbonate or calcium carbonate. In addition to the foregoing, the layer may also include inert fillers, dispersants, anti-stats, surfactants, wetting agents, preservatives and defoaming agents present in minor amounts as needed.

The image layer may comprise a single layer containing one or a mixture of different color-producing microcapsules, or 2 or 3 adjacent layers each containing one or a mixture of different color-producing microcapsules. The image layer may also comprise three layers disposed adjacent one another, a first layer comprising only cyan color-producing microcapsules, a second layer containing only magenta color-producing microcapsules and a third layer containing only yellow color-producing microcapsules.

The weight ratio of photosensitive microcapsules and developer material present in the image layer may generally range from about 2/8 to 8/2, more preferably 4/6 to 6/4 in terms of solids weight.

Adhesive layer (18) is prepared using an aqueous latex of a pressure sensitive adhesive polymer such as rubber-based (SBR) or acrylic-based polymer material, polyvinylacetate copolymers, ethylene/vinylacetate copolymers and similar adhesive materials. These adhesives are commercially available such as those distributed under the NACOR® brand by National Starch Corp. The composition may also contain surfactants, wetting agents, thickening agents, fillers and one or more water soluble polymers such as polyvinyl alcohol to facilitate the application of and the adhesion of this layer to other layers. The latex adhesive present in adhesive layer (18) may also be present in image layer (16), as described above.

The adhesive layer (18) may also be formulated to contain up to about 30 wt % of the particulate developer material described above. The presence of additional developer in the adhesive layer tends to improve the color forming reaction when the recording sheet is heat developed.

In another embodiment of this invention it has been found that the additional inclusion of one or a mixture of heat fusible crystalline compounds (thermal solvents and thermal non-solvents melting at different temperatures) in the image layer (16) and optionally in the adhesive layer (18) improves the heat responsiveness and image density of these layers while maintaining a high storage stability against fog. The thermal solvent is a crystalline material which, after melting by the application of heat, is a good solvent for the developer. Typically their melting points are lower than the melting points of the dyes or the developers. A non-solvent in this invention is a material typically having a melting point lower than the thermal solvent and which in its liquid form is not a solvent for either the dye or the developers, but in excess of 70° C. A non-solvent behaves as a heat transfer fluid to transfer heat efficiently and uniformly from the thermal head of the printer to the image layer and adhesive layer coating present adjacent the support layer.

Typical thermal solvents which melt at temperatures of at least about 70° C. include bisphenol A diacetate (BPADA), diphenyl phthalate, dicyclohexyl phthalate, diphenyl oxalate, benzyl oxynaphthalene, 1-hydroxy-2-naphthoate, rosin and m-terphenyl derivatives, bis-dialkylaryl ethane such as 1,2-bis(3,4-dimethylphenyl)ethane, as well as many of the heat meltable crystalline compounds disclosed at column 8 of U.S. Pat. No. 4,885,271.

Typical thermal non-solvents which melt at temperatures below the melting temperature of the thermal solvent used include 1,12-dihydroxydodecane, paraffin wax, bees wax, fatty acid, fatty acid amide, stearic acid, steramide, zinc stearate and more preferably hindered phenols such as 2,6-di-t-butyl-4-methylphenol (BHT), thiodiethylene hydrocinnamate (IRGANOX™ 1035 from Ciba-Geigy Corp.) tetrakis methane (IRGANOX™ 1010 from Ciba Geigy Corp.) and like materials such as described on columns 9, 10 and 11 of U.S. Pat. No. 4,885,271. Waxy materials are less preferred since they may cause adhesion problems when the base layer (20) is laminated to the adhesive layer (18) or the image layer (16).

When present, the thermal solvents and non-solvents may be used at levels in the range of about 5–200 weight %, based on the weight of the acidic developer, and each or both may comprise from about 1 to 30% by weight, on a dry weight basis, of the weight of the layer in which they are incorporated.

The photothermally sensitive recording sheet of this invention also includes a second opaque or transparent sheet material (20) which is bonded to the heat sensitive color-producing layer either directly or through adhesive layer (18). This sheet material may comprise a cellulose-based material such as paper, cardboard, opacified plastic or other opaque material, or a transparent plastic sheet material of the type described above used for the support layer (12). The thickness of this sheet material will generally range from about 1 to 7 mil, or about 25–180 microns. Transparent sheets are particularly useful in color proofing applications, whereas opaque sheets are useful for making photographs, labels, stickers, and computer print-out paper.

On the back of sheet layer (20) may be disposed a coating (22) containing an adhesive, preferably a pressure sensitive adhesive. This adhesive layer may comprise one or more conventional polymers selected from the group consisting of SBR or SBS rubber-based adhesive, acrylic-based adhesive, a polyvinylacetate-based adhesive and like materials, and may be the same type of adhesive as present in adhesive layer 18. A peelable disposable backing sheet consisting of a base sheet and a non-sticking silicone or wax layer formed thereon for facilitating peeling of the backing sheet off the adhesive layer may be attached to the adhesive layer to allow proper handling of the finished recording sheet. The presence of the adhesive layer (22) and peelable backing sheet are not required where the heat sensitive recording sheet is used as print-out paper, but is useful where the recording sheet is used as label materials or in color proofing applications.

The various layers described above may be applied to their respective substrates by any of the well known coating techniques. Thus aqueous dispersions of the coating composition may be applied using knife coating, VARI-BAR coating, slot die coating, meter bar coating, pure blade coating, rod blade coating, short dwell coating, curtain coating, gravure coating and microgravure coating methods. Following coating, the layers are preferably air dried.

In the preferred embodiment of this invention, the photothermally sensitive recording sheet comprises the embodiment shown in FIG. 2 wherein thermal slip layer (14) has a dry thickness in the order of about 0.1 to about 2 microns, transparent support layer (12) is biaxially oriented PET sheet having a thickness of about 3 to 8 microns, image layer (16) has a thickness of about 2 to 15 microns and adhesive layer (18) has a thickness of about 1 to 4 microns.

The recording sheets of the present invention are designed for use in high speed printing applications such as computer print out paper, battery operated printers for digital cameras or personal digital assistance, labels, medical imaging and color proofing films. The sheets are sensitive to any of ultraviolet, infrared, x-ray, ion beam and visible radiation. They may be used in systems containing modulated exposure producing elements which may be in the form of light emitting diodes (LED), liquid crystal display (LCD), lasers, fiber optics and the like. Full color images can be produced either optically or by means of exposure to modulated light sources of well-separate wavelength such as red, green and blue LED devices.

After exposure, the image is developed by heating the recording sheet. The preferred source of heat is a thermal imaging head of the type normally used for thermal printing. A thermal head having "n" dot per inch (dpi) wherein n is an integer including zero may be used. The thermal head may be segmented or non-segmented. It may be a thin or thick film thermal head. The advantage of using a thermal head is its efficiency to heat to 200–400° C. within a msec time scale and cool down in about 10 msec. This unique property allows a very good control of the heat development process.

The recording sheet slip layer (14) is brought into sliding contact with a thermal head uniformly heated to a temperature of about 200–°400° C. for a period of time sufficient to develop the image, normally about 0.1 to 100 milliseconds, more preferably 0.2–20 milliseconds, even more preferably 1–12 msec. The presence of slip layer (14) on the surface of the recording sheet prevents the surface from dragging on the thermal head and facilitates efficient high speed printing.

For full color printing, exposure of the recording sheet to a red light (650 nm) hardens microcapsules in the image layer which contain both the photoinitiator selectively sensitive to red light and the cyan leuco dye; heat development results in permeation of the capsules containing the magenta and yellow dyes by the developer which, when combined, form a red image. Similarly, exposure to a green light (550 nm) and a blue light (430 nm) selectively photoharden the magenta and yellow dye-containing capsules respectively, and the complimentary colors are developed to produce green and blue images respectively. Exposure of all microcapsules to broad band radiation (white light) results in no color (white) and exposure of none of the microcapsules results in a black image.

The following examples are illustrative of the invention. Materials used in the following examples are identified as follows:

| METHOCEL ™ K15 | cellulose-based thickening agent from Dow Chemical Corp. |
| AEROSOL ™ OT | sodium bis (2-ethylhexyl) sulfosuccinate surfactant |
| TRITON ™ X-100 | t-octylphenoxypolyethoxyethanol non ionic surfactant |
| NACOR ™ 8685 | pressure sensitive latex adhesive available from National Starch Corp. |
| AIRVOL ™ | polyvinyl alcohol from Air Products and Chemical Corp. |
| SURFYNOL ™ 104 | 2,4,7,9-tetramethyl-5-decyne-4,7 diol surface tension lowering agent from Air Products and Chemical Corp. |
| BHT | 2,6-di-t-butyl-4-methylphenol (thermal non-solvent) |
| BPA | bisphenol A (Acidic developer) |
| BPADA | bisphenol A diacetate (Thermal solvent) |

EXAMPLE 1

Preparation of Black Leuco Dye Capsule B-1

TABLE 1

| | Ingredients | Wt (g) |
|---|---|---|
| 1A | Black leuco dye BK-400 | 7 |
| 1B | Black leuco dye S-205 | 7 |
| 1C | 2-Isopropyl Naphthalene | 10.5 |
| 1D | SR-351(TMPTA) | 24.5 |
| 1E | Polyisocyanate, DESMODURCB75N(75%) | 14 |
| 1F | Polyisocyanate, DESMODUR N3300 | 10.5 |
| 1G | Ethyl Acetate | 6 |

Compounds 1A to 1C were mixed with 25 g of methyl ethyl ketone (MEK) and heated with a hot plate until completely dissolved. The solution was cooled to room temperature. Compounds 1D to 1F were added and stirred until the solution became homogeneous. MEK was removed with a rotary evaporator and the viscous liquid was diluted with ethyl acetate (G). 60 g of the oil was poured into a 40° C. solution comprising 30 g of Airvol 540(9.8%), 30 g of Airvol 203(10%), 100 g of D.I. Water, and 8 g of 20% sodium carbonate. The mixture was emulsified with a Silverson LR$_4$ mixer at 6000 rpm for 20 minutes. 0.24 g of dibutyl tin dilaurate (DBTDL) and 2.4 g of diethylentri- amine (DETA) in 6 g of water were added. The emulsion was heated to 60° C., emulsified for another 30 minutes, stirred at 700 rpm by using an overhead stirrer for two more hours at 60° C., and overnight at room temperature to complete the capsule formation. The average size was determined by Coulter Counter to be about 2.5 μm.

EXAMPLE 2

Preparation of Black Leuco Dye Capsule B-2

TABLE 2

| | Ingredients | Wt (g) |
|---|---|---|
| 2A | Black leuco dye BK-400 | 9.6 |
| 2B | Black leuco dye S-205 | 9.6 |
| 2C | 2-Isopropyl Naphthalene | 10.3 |
| 2D | SR-351(TMPTA) | 28.1 |
| 2E | MEHQ | 0.1 |
| 2F | Polyisocyanate, DESMODUR N3300 | 9 |
| 2F | Polyisocyanate, DESMODUIR CB75N(75%) | 36 |
| 2G | Ethyl Acetate | 10 |

Compounds 2A to 2E were mixed in a beaker and heated to 100° C. until 2A and 2B were completely dissolved. The solution was cooled to room temperature and added with 2F and 2G. The solution was poured to a 30° C. solution comprising 58 g of Airvol 540(9.8%), 58 g of Airvol 203(10%), and 100 g of D.I. Water. The mixture was emulsified with a Silverson LR$_4$ mixer at 4000 rpm for 30 minutes. pH of the dispersion was controlled at 8.0 by adding a 20% aqueous solution of sodium carbonate continuously. 6 g of 15% SMA-1440H (by Elf Atochem) and 1.8 g of DETA were added and the emulsion was stirred at 60° C. for another 3 hrs at 700 rpm by using a overhear stirrer to complete the capsule formation. The capsules showed an average size of about 2 μm.

EXAMPLE 3

Preparation of Photosensitive Black Leuco Dye Capsule B-3

TABLE 3

| | Ingredients | Wt (g) |
|---|---|---|
| 3A | Black leuco dye BK-400 | 9.6 |
| 3B | Black leuco dye S-205 | 9.6 |
| 3C | 2-Isopropyl Naphthalene | 4.8 |
| 3D | SR-351(TMPTA) | 28.6 |
| 3E | MEHQ | 0.1 |
| 3F | Polyisocyanate, DESMODUR CB75N(75%) | 36 |
| 3G | Polyisocyanate, DESMODUR N3300 | 9 |
| 3H | Photosensitizer, 3,3'-Carbonylbis(7-diethylaminocoumarine) (CBDC) | 0.29 |
| 3I | Ethyl N'N-dimethylbenzoate (EPD) | 1.14 |
| 3J | Ethyl Acetate | 10 |

Compounds A to E were mixed in a beaker and heated to 100° C. until A and B were completely dissolved. The solution was cooled to room temperature and compounds F to J were added in safety light. The solution was poured to a solution comprising 58 g of Airvol 540(9.8%), 58 g of Airvol 203(10%), and 100 g of D.I. Water and emulsified with a Silverson LR$_4$ mixer at 4000 RPM for 30 minutes at 30° C. pH of the dispersion was controlled at 8.0 by using a 20% sodium carbonate in D.I. water. 1.8 g of DETA and 2.4 g of 15% SMA-1440H were added and the temperature was raised to 60° C. The capsule was stirred at 700 rpm for another 2.5 hrs to complete the capsule formation. The capsules showed an average size of about 2 μm.

EXAMPLE 4

Preparation of Photosensitive Black Leuco Dye Capsule B-4

TABLE 4

| | Ingredients | Wt (g) |
|---|---|---|
| 4A | Black leuco dye BK-400 | 9.6 |
| 4B | Black leuco dye S-205 | 9.6 |
| 4C | 2-Isopropyl Naphthalene | 4.8 |
| 4D | SR-351(TMPTA) | 28.6 |
| 4E | MEHQ | 0.1 |
| 4F | PPO(Polypropyleneoxide, Mn = 425) | 4.8 |
| 4G | DESMODUR CB75N(75%) | 36 |
| 4H | DESMODUR N3300 | 9 |
| 4I | Photosensitizer, CBDC | 0.29 |
| 4J | EPD | 1.14 |
| 4K | Ethyl Acetate | 10 |

The same as Example 3, except the capsule formulation was changed as shown in Table 4. The capsules showed an average size of about 2 μm.

EXAMPLE 5

Preparation of Photosensitive Black Leuco Dye Capsule B-5

TABLE 5

| | Ingredients | Wt (g) |
|---|---|---|
| 5A | Black leuco dye BK-400 | 9.6 |
| 5B | Black leuco dye S-205 | 9.6 |
| 5C | 2-Isopropyl Naphthalene | 4.8 |
| 5D | SR-351(TMPTA) | 28.6 |
| 5E | (MEHQ | 0.1 |
| 5F | Hydroquinone bis(2-hydroxyethyl)ether | 5.06 |
| 5G | Aerosol OT | 0.19 |
| 5H | DESMODUR CB75N(75%) | 36 |
| 5I | DESMODUR N3300 | 9 |
| 5J | Photosensitizer, CBDC | 0.29 |
| 5K | EPD | 1.14 |
| 5L | Ethyl Acetate | 10 |

The same as Example 3, except the capsule formulation was changed as shown in Table 5. The capsules showed an average size of about 2 μm.

EXAMPLE 6

Preparation of Photosensitive Black Leuco Dye Capsule B-6

TABLE 6

| | Ingredients | Wt (g) |
|---|---|---|
| 6A | Black leuco dye BK-400 | 5.25 |
| 6B | Black leuco dye S-205 | 5.25 |
| 6C | 2-Isopropyl Naphthalene | 7 |
| 6D | SR-351(TMPTA) | 21 |
| 6E | SR399 | 3.5 |
| 6F | PPO(Polypropylene Oxide, Mn = 425) | 3.5 |
| 6G | MEHQ | 0.02 |
| 6H | Aerosol OT | 0.35 |

TABLE 6-continued

| | Ingredients | Wt (g) |
|---|---|---|
| 6I | Photoinitiator 8C (Cyanine Borate, 550 nm) | 0.12 |
| 6J | Thermal Stabilizer, Q-1301 (Wako Chemicals, USA, Richmond, VA) | 0.02 |
| 6K | DESMODUR CB75N(75%) | 24.5 |
| 6L | DESMODUR N3300 | 6.13 |
| 6M | Ethyl Acetate | 7 |

The same as Example 3, except the capsule formulation was changed as shown in Table 5. The capsules showed an average size of about 2 μm.

EXAMPLE 7

Preparation of Developer Dispersions 50 g of BPS-24 (2,4'-dihydroxy diphenyl sulfone), 20 g of 9.8% Airvol 540 in water, 20 g of 10% Airvol 203 in water, 0.67 g of AOT, 1.34 g of SMA 1440 H, and 73 g of D.I. water were mixed with 1000 g of zirconium ceramic bead in a stainless steel vessel. The mixture was stirred overnight with a lab mixer until the particle size was below 1.5 μm.

Other developer and co-developer dispersion prepared by the similar method include bisphenol-A (BPA), hydroxy benzyl benzoate (HBB), N-p-toluenesulfonyl-N'-phenylurea TUPH), 4,4'-bis(p-toluenesulfonylamino-carbonylamino) diphenyl methane (BTUM), bis(3-allyl-4-hydroxyphenyl) sulfone) (TGSA), 3,3'-diethylenedioxydiphenyl (EDP), 4,4'-ethylene bisphenol (EBP), N,N-bis(2-tolylsulfonyloxyethyl)-p-toluenesulfonamide, N-(4-hydroxyphenyl)stearamide, and 4-(benzyloxy)phenol.

EXAMPLE 8

Preparation of Thermal Solvent Dispersions 50 g of m-Terphenyl, 20 g of 9.8% Airvol 540, 20 g of 10% Airvol 203, 0.67 g of AOT, 0.67 g of Surfynol CT-131, and 73 g of deionized water were mixed with 1000 g of ceramic bead in a stainless steel beaker. The mixture was stirred overnight with a lab mixer until the particle size was below 1.5 μm.

Other thermal solvent dispersions prepared by the same method include: diphenyl oxalate (HS-2046), dimethylphenyl oxalate (HS-3051), dicyclohexane phthalate (DCP), and diphenyl phthalate (DPP), bisphenol A diacetate, benzyl oxynaphthalene. Other additives which might be used to improve other properties can also be prepared by the same method. These include paraffin wax, 2,6-di-t-butyl-4-methylphenol (BHT), Irganox 1035, Irganox 1010, 1,12-dihydroxydodecane, stearamide, stearic acid, zinc stearate. The mean particle size of all the dispersions were controlled to be about 1.5–2 microns.

EXAMPLE 9

Preparation of Image Coat 11.95 g of the B-1 black capsule(29.3% solid), 6.68 g of HBB developer dispersion (34.5% solid, as prepared in Example 7), 5.49 g of m-Terphenyl(28% solid, as prepared in Example 8,) 1.73 g of 10% Airvol 540, 0.075 g of Surfynol 440, and 4.08 g of water were mixed thoroughly to give a 25% solid mixture. pH was adjusted to 8.0 with 20% sodium carbonate solution in water. The mixture was coated onto a 2 mil white PET film by a #10 Myrad bar and dried for 5 minutes at 50° C. The dry coverage was measured by a Mitutoyo thickness gauge to be about 5 μm.

EXAMPLE 10

Preparation of Image Coat 7.68 g of B-1 black capsule(29.3% solid, Example 1), 6.0 g of BPS-24 developer dispersion (27.05% solid, as prepared in Example 7), 3.34 g of HS-2046(32.42% solid, as prepared in Example 8), 0.43 g of 10% Airvol 540, 0.05 g of Surfynol 440, and 2.48 g of water were mixed thoroughly. pH was adjusted to 8.0 with 20% sodium carbonate. The mixture was coated onto a 2 mil white PET film by a #10 Myrad bar and dried for 5 minutes at 50° C. The dry coverage was measured by a Mitutoyo thickness gauge to be about 5 μm.

EXAMPLE 11

Preparation of Image Coat 6.27 g of B-2 black capsule(34.2% solid, as prepared in Example 2), 4.52 g of TGSA developer dispersion (31.21% solid, as prepared in Example 7), 2.9 g of HS-2046(32.42% solid), 1.57 g of 4-benzyloxyphenol (24.77%, as prepared in Example 7), 0.13 g of Coatosil 1301(silicone surfactant, 20% solid in water, from OSi, Friendly, W.V.), 1.02 g of 10% Airvol 540, and 3.28 g of D.I. water were mixed thoroughly. pH was adjusted to 8.0 with 20% sodium carbonate. The mixture was coated onto a 2 mil white PET film by a #10 Myrad bar and dried for 5 minutes at 50° C. The dry coverage was measured by a Mitutoyo thickness gauge to be about 5 μm.

EXAMPLE 12

Preparation of Image Coat 7.68 g of B-5 black capsule(28.6% solid, Example 5), 4.19 g of HBB developer dispersion (34.5% solid), 3.44 g of m-Terphenyl(28% solid, as prepared in Example 8), 0.83 g of Ludox AM-30(30% solid, from Grace Davision), 1.73 g of 10% Airvol 540, 0.05 g of Surfynol 440, and 2.23 of water were mixed thoroughly to give a 25% solid mixture. pH was adjusted to 8.0 with 20% sodium carbonate. The mixture was coated onto a 2 mil white PET film by a #10 Myrad bar and dried for 5 minutes at 50° C. The dry coverage was measured by a Mitutoyo thickness gauge to be about 5 μm.

EXAMPLE 13

Preparation of Image Coat 6.28 g of B-3 black capsule(35% solid, Example 3), 4.19 g of HBB developer dispersion (34.5% solid), 3.44 g of m-Terphenyl(28% solid), 0.83 g of Ludox AM-30(30% solid), 1.57 g of 10% Airvol 540, 0.05 g of Surfynol 440, and 3.63 g of water were mixed thoroughly to give a 25% solid mixture. pH was adjusted to 8.0 with 20% sodium carbonate. The mixture was coated onto a 2 mil white PET film by a #10 Myrad bar and dried for 5 minutes at 50° C. The dry coverage was measured by a Mitutoyo thickness gauge to be about 5 μm.

EXAMPLE 14

Preparation of Image Coat 5.7 g of B-4 black capsule(38.54% solid, Example 4), 4.19 g of HBB developer dispersion (34.5% solid), 3.44 g of m-Terphenyl(28% solid), 0.83 g of Ludox AM-30(30% solid), 1.57 g of 10% Airvol 540, 0.05 g of Surfynol 440, and 4.21 g of water were mixed thoroughly to give a 25% solid mixture. pH was adjusted to 8.0 with 20% sodium carbonate. The mixture was coated onto a 2 mil white PET film by a #10 Myrad bar and dried for 5 minutes at 50° C. The dry coverage was measured by a Mitutoyo thickness gauge to be about 5 μm.

EXAMPLE 15

Preparation of the Photothermally Sensitive Recording Sheet

An adhesive coat containing 20 dry-wt % of Rovene 4823 latex (SBR latex from Mallard Creek Polymers, Inc., Akron, Ohio), 1 dry-wt % of Airvol 540, and 0.5 dry-wt % of Coatosil 1301 in water was coated on the untreated side of Toray PET ribbon 4.5F531 (about 4.5 microns thick with one side treated with a thermal slip layer) with a #2.5 Myrad bar, dried for 5 minutes at 50° C. The adhesive coated ribbon was then laminated with the image coats (Examples 9–15) under pressure @40° C. to give a photothermally sensitive recording sheet.

The laminated samples were then printed from the ribbon side by an Atlantek Model 200 thermal test printer equipped with a Kyocera 200 dpi thermal head with a $t_{cycle}$=4 msec and $t_{on}$=0–1.2 msec. A high quality, durable glossy black image was obtained. The maximum density (Dmax) and minimum density (Dmin) of the photothermally sensitive recording sheet are listed in the Table 7. Good thermal sensitivity with acceptable Dmin stability was observed for all the samples. Examples 12–13 were exposed from the ribbon side with a 100 W halogen-tungsten lamp at a distance of 6 inches for 30 sec. and printed with the thermal test printer again. Significant reduction of Dmax after exposure was observed in all samples. The optical density of the thermally developed samples decreases as the exposure time increases.

TABLE 7

| Example | Photosensitivity | Developer | Thermal Solvent | Additives | Dmax | Dmin |
|---|---|---|---|---|---|---|
| 9 | none | HBB | m-Terphenyl | none | 0.88 | 0.1 |
| 10 | none | BPS-24 | HS-2046 | none | 0.88 | 0.12 |
| 11 | none | TGSA | m-Terphenyl | 4-(benzyloxy)phenol | 0.94 | 0.12 |
| 12 | UV-blue | HBB | m-Terphenyl | Ludox AM | 0.95 | 0.13 |
| 13 | UV-blue | HBB | m-Terphenyl | Ludox AM | 0.96 | 0.12 |
| 14 | UV-blue | HBB | m-Terphenyl | Ludox AM | 0.92 | 0.15 |

EXAMPLE 16

COMPARATIVE EXAMPLE

Heat Development by IR Heater or Conventional Oven

The heat development experiments were repeated except the thermal head was replaced by an IR heater or a conventional oven at 60–150° C. Very poor Dmin and Dmax were observed in all cases.

EXAMPLE 17

COMPARATIVE EXAMPLE

Thermal Development Using an Untreated Ribbon

The experiments of Example 15 were repeated, except a 4.5 micron ribbon without the thermal slip coating was used. The developed image showed significant defects and very poor uniformity.

What is claimed is:

1. A photothermally sensitive recording sheet comprising:
    (a) a transparent first sheet material having first and second surfaces, and having a thickness of less than 8 µm;
    (b) disposed on the first surface of the first sheet material, a thermal slip layer;
    (c) a second sheet material having first and second surfaces; and
    (d) disposed between the second surface of the first sheet material and the first surface of the second sheet material, a photothermally sensitive imaging layer comprising:
        (i) a finely divided particulate developer having a melting point or melt flow temperature in excess of 70° C., which is reactive in contact with a color dye precursor to form a color, and
        (ii) heat developable, light sensitive microparticles each comprising a polymeric wall or matrix material and containing, distributed within the microparticle, a photopolymerizable or photocrosslinkable material, a photoinitiator for that material, and a color dye precursor reactive with the developer where the microparticles are photohardenable by exposure to actinic radiation and, if not photohardened, are sufficiently permeable to permit contact of the color dye precursor with the developer when heated above the melting point or flow temperature of the developer and, if photohardened, are sufficiently impermeable to prevent contact of the color dye precursor with the developer even when heated above the melting point or flow temperature of the developer.

2. The recording sheet of claim 1 where the first sheet material has a thickness between 3 µm and 8 µm.

3. The recording sheet of claim 2 where the first sheet material is polyethylene terephthalate.

4. The recording sheet of claim 1 where the thermal slip layer comprises a lubricating slip agent dispersed in a thermoset polymer binder.

5. The recording sheet of claim 1 where the second sheet material is opaque.

6. The recording sheet of claim 1 further comprising an adhesive layer disposed between the imaging layer and the second sheet material.

7. The recording sheet of claim 1 where the imaging layer further comprises a polymeric binder.

8. The recording sheet of claim 1 where the microparticles are microcapsules.

9. The recording sheet of claim 1 where the microparticles have an average particle size of less than 4 µm.

10. The recording sheet of claim 9 where the microparticles have an average particle size of less than 2 µm.

11. The recording sheet of claim 1 where the developer has an average particle size of less than 3 µm.

12. The recording sheet of claim 1 where the imaging layer further comprises a heat fusible crystalline compound.

13. The recording sheet of claim 12 where the crystalline compound, when melted, is a solvent for the developer and/or a plasticizer for the polymeric wall or matrix material of the microparticles.

14. The recording sheet of claim 13 where the crystalline compound, when melted, is a plasticizer for the polymeric wall or matrix material of the microparticles.

15. The recording sheet of claim 14 where the crystalline compound is inside the microparticles.

16. The recording sheet of claim 12 where the crystalline compound, when melted, is not a solvent for the developer.

17. The recording sheet of claim 16 where the crystalline compound is outside the microparticles.

18. The recording sheet of claim 12 where the crystalline compound is present at 5–200% by weight of the developer.

19. The recording sheet of claim 1 where the imaging layer comprises three kinds of microparticles:
    a first containing a cyan dye precursor,
    a second containing a magenta dye precursor, and
    a third containing a yellow dye precursor.

20. The recording sheet of claim 1 where the imaging layer comprises microparticles containing a photoinitiator sensitive to UV light.

21. The recording sheet of claim 1 where the imaging layer comprises microparticles containing a photoinitiator sensitive to IR light.

22. A thermal imaging process comprising the steps of:
    (a) imagewise exposing the recording sheet of claim 1 to a pattern of actinic radiation so that microparticles sensitive to the radiation are selectively photohardened, and
    (b) heating the exposed recording sheet to a temperature above the melting point or flow temperature of the developer so that the developer contacts the dye precursor in those microparticles that are not photohardened and forms a color image.

23. The process of claim 22 where the imaging layer of the recording sheet comprises three kinds of microparticles:
    a first containing a cyan dye precursor,
    a second containing a magenta dye precursor, and
    a third containing a yellow dye precursor;
    and the step of imagewise exposing the recording sheet comprises imagewise exposing to form a full color image.

24. The process of claim 22 where the step of heating the exposed recording sheet comprises moving contact of the slip layer of the recording sheet with a thermal printing head maintained at a temperature of 180–400° C.

25. The process of claim 24 where the contact occurs for a time of 0.1–50 milliseconds.

26. The process of claim 25 where the contact occurs for a time of 0.2–20 milliseconds.

27. The process of claim 24 where the thermal printing head has a resolution of 200 dots per inch.

* * * * *